United States Patent
Huang et al.

(10) Patent No.: US 7,214,612 B2
(45) Date of Patent: May 8, 2007

(54) DUAL DAMASCENE STRUCTURE AND FABRICATION THEREOF

(75) Inventors: Jen-Ren Huang, Tainan County (TW); Cheng-Ming Weng, Hsinchu County (TW); Miao-Chun Lin, Tainan County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 11/162,154

(22) Filed: Aug. 31, 2005

(65) Prior Publication Data

US 2007/0049012 A1 Mar. 1, 2007

(51) Int. Cl.
*H01L 21/4763* (2006.01)

(52) U.S. Cl. ............... 438/638; 438/639; 257/E21.579

(58) Field of Classification Search ............... 438/618, 438/624, 637–640; 257/E21.579
See application file for complete search history.

(56) References Cited

U.S. PATENT DOCUMENTS

| 2003/0199169 A1* | 10/2003 | Jun et al. ............... 438/694 |
| 2004/0166666 A1* | 8/2004 | Usami .................. 438/629 |
| 2004/0219796 A1* | 11/2004 | Wu ....................... 438/709 |

* cited by examiner

*Primary Examiner*—Brook Kebede
(74) *Attorney, Agent, or Firm*—Jiang Chyun IP Office

(57) ABSTRACT

A dual damascene structure is described, including a substrate, a dielectric layer, a hard mask layer, a contact and a conductive line. The dielectric layer is located on the substrate, the hard mask layer is on the dielectric layer, the contact is located in the dielectric layer, and a horizontal cross-section of the contact has an asymmetrically rounded outline. The conductive line is in the hard mask layer and the dielectric layer, and is located on and electrically connected to the contact. The conductive line has a laterally swelling portion on an edge portion of the first contact, wherein the borders of the laterally swelling portion and the edge portion are contiguous.

8 Claims, 4 Drawing Sheets

DUAL DAMASCENE STRUCTURE AND FABRICATION THEREOF

BACKGROUND OF THE INVENTION

1. Field of the Invention

The present invention relates to a structure of semiconductor device and a method for fabricating the same. More particularly, the present invention relates to a dual damascene structure and a method for fabricating the same.

2. Description of the Related Art

Currently, dual damascene techniques are widely used to embed metal inter-connect structures in insulating layers. By using dual damascene methods, the overlay errors and the process biases between metal contacts and lines can be reduced, as compared with the conventional method that forms a metal contact first and then directly defines a metal line. Consequently, the reliability and throughput of products can be improved. Hence, dual damascene techniques are very important in advanced semiconductor processes where devices are highly integrated.

In some dual damascene methods, the trench is defined with a hard mask layer with a trench pattern therein, and the contact hole is defined with a patterned photoresist layer with a contact-hole pattern therein that is formed after the hard mask layer. However, when misalignment occurs between the trench pattern and the contact-hole pattern such that the contact-hole pattern exposes a portion of the hard mask layer, the etching step of the contact hole is restricted by the hard mask layer to reduce the cross-sectional area of the contact hole. Therefore, the cross-sectional area of the contact formed later is also reduced, so that the contact resistance is raised to lower the speed of the device or even decrease the yield of the process.

SUMMARY OF THE INVENTION

Accordingly, this invention provides a method for fabricating a dual damascene structure to improve the contact resistance problem due to lithographic misalignment.

This invention also provides a dual damascene structure wherein the contact resistance is less affected by lithographic misalignment.

The method for fabricating a dual damascene structure of this invention is described as follows. A dielectric layer and a hard mask layer are sequentially formed on a substrate, and then a trench pattern is formed in the hard mask layer. A first patterned photoresist layer is formed over the substrate, having a contact-hole pattern therein exposing a portion of the hard mask layer. A pull-back step is performed to pull back the hard mask layer exposed by the contact-hole pattern. The first patterned photoresist layer is used as a mask to remove a portion of the dielectric layer, so as to form an opening in the dielectric layer. After the first patterned photoresist layer is removed, the hard mask layer is used as a mask to etch the dielectric layer down to the substrate, so as to form a contact hole and a trench passing over the contact hole in the dielectric layer. A conductive layer is then formed in the trench and the contact hole.

In one embodiment, the hard mask layer includes a metal hard mask layer, which may include at least one material selected from the group consisting of Ti, TiN, Ta, TaN and WN.

In addition, the hard mask layer may be formed through, for example, chemical vapor deposition (CVD) or physical vapor deposition (PVD), and the pull-back step done to the hard mask layer may include a bombardment process with plasma. The dielectric layer may include a low-k material having a dielectric constant lower than 4, while the material of the conductive layer may include copper (Cu).

Moreover, the trench pattern may be formed in the hard mask layer with the following steps, for example. A second patterned photoresist layer having the same trench pattern therein is formed on the hard mask layer, and is then used as a mask to etch the hard mask layer down to the dielectric layer.

The dual damascene structure of this invention can be fabricated based on the above method of this invention. The dual damascene structure includes a substrate, a dielectric layer on the substrate, a hard mask layer on the dielectric layer, a first contact in the dielectric layer, and a conductive line in the hard mask layer and the dielectric layer. The first contact has a horizontal cross-section with an asymmetrically rounded outline, and the conductive line passes over and electrically connects with the first contact. The conductive line has a laterally swelling portion on an edge portion of the first contact, wherein the borders of the laterally swelling portion and the edge portion are contiguous.

Moreover, the above dual damascene structure may further include a second contact between the substrate and the conductive line, the second contact having a horizontal cross-section with a symmetrically rounded outline. The first contact, the second contact and the conductive line may include the same conductive material, such as, copper (Cu).

Since a pull-back step is conducted before the contact-hole etching step to pull back the hard mask layer exposed by the contact-hole pattern of the photoresist layer due to misalignment, the cross-sectional area of the misaligned contact hole is increased, as compared with an equally misaligned contact hole in the prior art. Thus, the contact area between the misaligned contact and the device can be increased to lower the contact resistance, so as to increase the speed of the device as well as to improve the reliability and even the yield of the products.

It is to be understood that both the foregoing general description and the following detailed description are exemplary, and are intended to provide further explanation of the invention as claimed.

DESCRIPTION OF THE PREFERRED EMBODIMENTS

FIGS. 1A–1F illustrate, in a cross-sectional view, a process flow of fabricating a dual damascene structure according to the preferred embodiment of this invention.

Figure 1A:
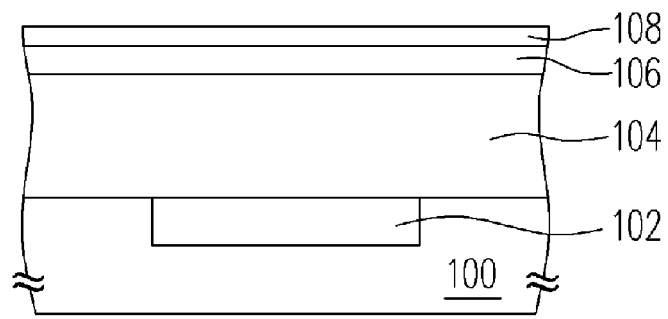
FIGS. 1A–1F illustrate, in a cross-sectional view, a process flow of fabricating a dual damascene structure according to a preferred embodiment of this invention.

Referring to FIG. 1A, a substrate 100 formed with a device region 102 thereon is provided, which may be one substrate of any type suitably used in certain process. A dielectric layer 104 is then formed over the substrate 100, wherein the material of the dielectric layer 104 is, for example, a low-k material that has a dielectric constant lower than 4. Examples of the low-k material include inorganic materials like hydrogen silsesquioxane (HSQ) and fluorinated silicate glass (FSG), etc., and organic materials like fluorinated poly-(arylene ether) (Flare), poly-(arylene ether) (SILK) and parylene, etc. The dielectric layer 104 may be formed through CVD or spin-on coating.

A hard mask layer 108 is then formed on the dielectric layer 104. The hard mask layer 108 may include a metal hard mask layer, which may be formed from Ti, TiN, Ta, TaN or WN through, for example, CVD or PVD.

In one embodiment, an inorganic insulating layer 106 may be formed on the dielectric layer 104 before the hard mask layer 108 is formed. The material of the inorganic insulating layer 106 may be TEOS-oxide, and the method of forming the same may be CVD. The inorganic insulating layer 106 not only is easier to polish than an organic low-k material, but also can prevent the dielectric layer 104 from being polished and damaged in the CMP process when the latter includes an organic low-k material.

Figure 1B:
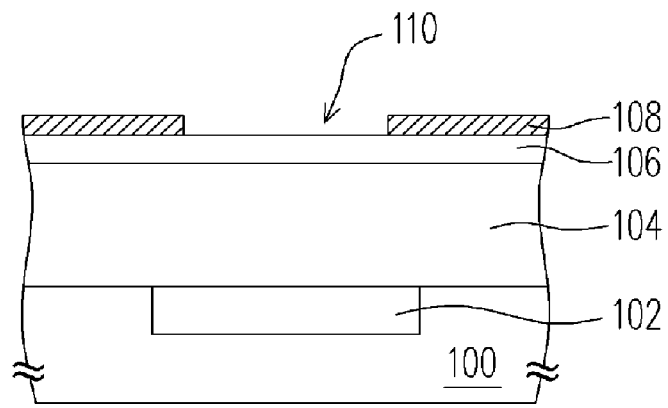

Referring to FIG. 1B, a trench pattern 110 is formed in the hard mask layer 108, passing over the device region 102 and exposing a portion of the inorganic dielectric layer 106. The trench pattern 110 may be formed by, for example, forming a patterned photoresist layer having the same trench pattern on the hard mask layer 108 and then using the patterned photoresist layer as a mask to etch, possibly through reactive ion etching (RIE), the hard mask layer 108 down to the inorganic insulating layer 106.

Figure 1C:
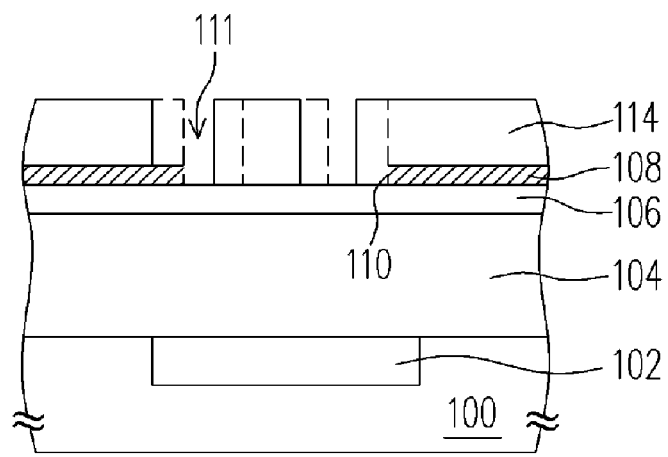

Referring to FIG. 1C, a patterned photoresist layer 114 having a contact-hole pattern 111 therein is formed over the substrate 100. An anti-reflection coating (ARC, not shown) is preferably formed over the substrate before the patterned photoresist layer 114 for reducing reflected light in the later lithography process. The material of the ARC may be silicon oxynitride or other material capable of reducing reflected light, and the ARC may be formed through CVD, for example.

Ideally, the contact-hole pattern 111 should be aligned with the trench pattern 110, as indicated by dash lines. However, as misalignments occur in the lithography process, the contact-hole pattern 111 will be shifted to expose a portion of the hard mask layer 108. If a contact hole is directly defined using the patterned photoresist layer 114 and the exposed hard mask layer 108 as a mask without a pre-treatment, the contact area between the contact and the device will be much decreased to raise the contact resistance and lower the speed of the device significantly. In view of this problem, this invention provides such a pre-treatment method.

Figure 1D:
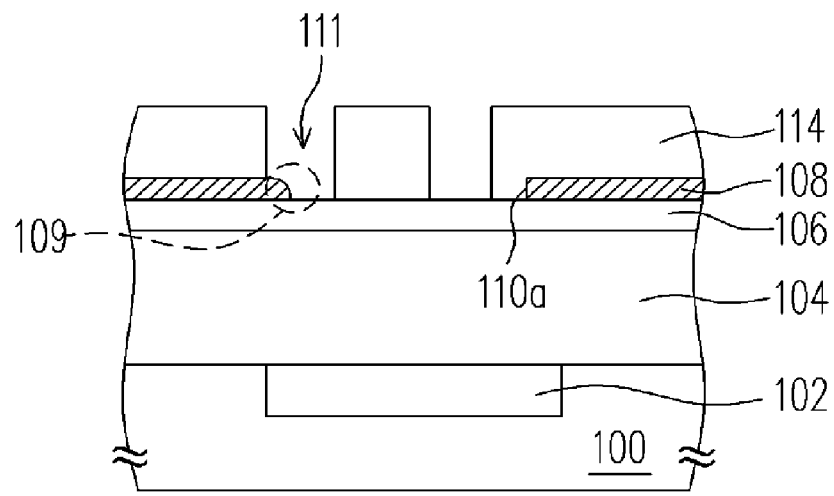

Referring to FIG. 1D, the pre-treatment is a pull-back step that pulls back the hard mask layer 108 exposed by the contact-hole pattern 111 in the patterned photoresist layer 114. The pull-back step may include a bombardment process, for example, which may utilize noble-gas plasma to bombard the exposed hard mask layer 108. In such cases, only an edge portion 109 of the exposed hard mask layer 108 is removed, and a certain percentage of the same still remains under the contact-hole pattern 111.

Figure 1E:
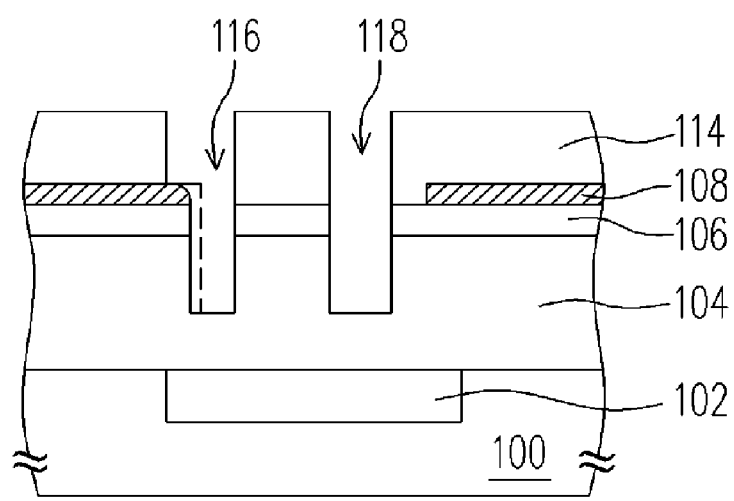

Referring to FIG. 1E, the patterned photoresist layer 114 and the exposed hard mask layer 108 are used as an etching mask to remove a portion of the inorganic insulating layer 106 and a portion of the dielectric layer 104, so as to form two openings 116 and 118 in the inorganic insulating layer 106 and the dielectric layer 104. Since the edge portion 109 of the exposed hard mask layer 108 has been removed (FIG. 1D), the inorganic insulating layer 106 and a portion of the dielectric layer that are 104 previously under the edge portion 109 are also removed in this etching step, as indicated by the dash line.

Figure 1F:
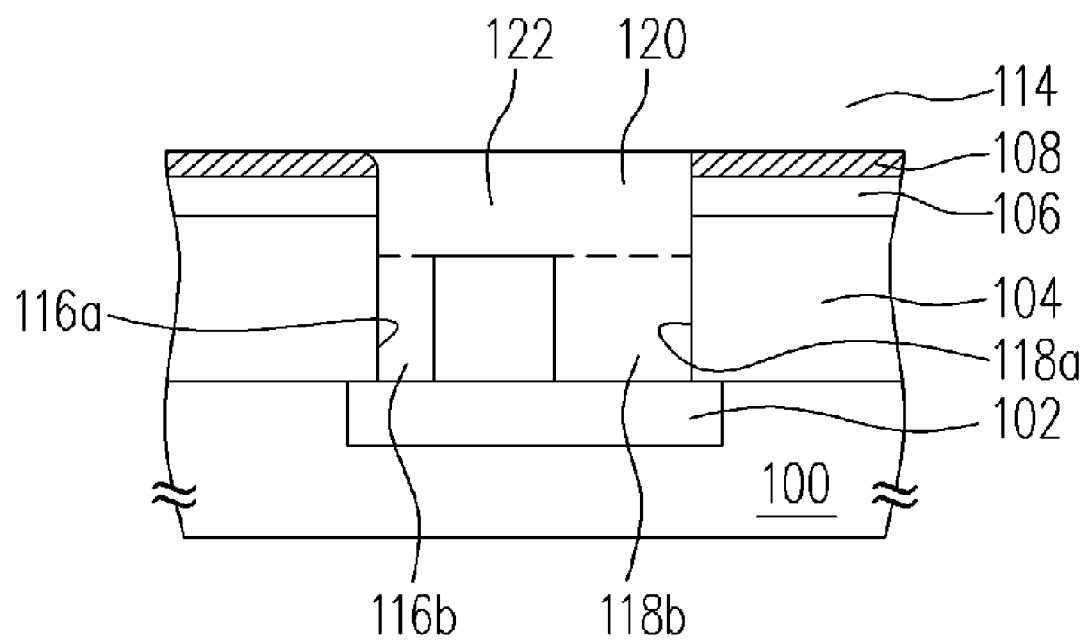

Referring to FIG. 1F, the patterned photoresist layer 114 is removed, and then the hard mask layer 108 is used as a mask to etch the dielectric layer 104 down to the substrate 100, so that a trench 110a is formed in the dielectric layer 104 and the openings 116 and 118 are deepened to form contact holes 116a and 118a. Since the edge portion 109 of the exposed hard mask layer 108 has been removed (FIG. 1D), the dielectric layer 104 previously under the edge portion 109 of the exposed hard mask layer 108 is completely removed through the above two etching steps.

Thereafter, a conductive layer 120 is formed in the trench 110a and the contact holes 116a and 118a to form a conductive line 122 and contacts 116b and 118b. Since the inorganic insulating layer 106 and the dielectric layer 104 previously under the edge portion 109 of the exposed hard mask layer 108 are also removed, the conductive line 122 has a laterally swelling portion on an edge portion of the contact 116b, as indicated by the shadow region in FIG. 2. The horizontal outline of the laterally swelling portion of the conductive line 122 superimposes that of the edge portion of the contact 116b and that of the previously existing edge portion 109 (FIG. 1D) of the exposed hard mask layer 108. Accordingly, the borders of the laterally swelling portion of the conductive line 122 and the edge portion of the contact 116b are contiguous.

The conductive layer 120 may include copper (Cu) or other metal, and may be formed by, for example, depositing a layer of conductive material over the substrate 100 through CVD and then removing, possibly through CMP, a portion of the conductive material until the hard mask layer 108 is exposed.

It is particularly noted that the above pull-back step can remove an edge portion 109 of the hard mask layer 108 exposed by the patterned photoresist layer 114, so that the size of the misaligned contact hole 116a is increased, as indicated by FIG. 1E. Therefore, the contact area between the contact in the dual damascene structure formed later can be increased to lower the contact resistance and thereby increase the speed of the device.

The dual damascene structure fabricated with the above method of this invention is described next.

Referring to FIG. 1F again, the dual damascene structure of this invention includes a substrate 100, a dielectric layer 104, a hard mask layer 108, a contact 116b and a conductive line 122. The dielectric layer 104 is disposed on the substrate 100, possibly including a low-k material having a dielectric constant lower than 4. The hard mask layer 108 is disposed on the dielectric layer 104, and may include a metal hard mask layer possibly formed from Ti, TiN, Ta, TaN or WN. The conductive line 122 is located in the hard mask layer 108 and the dielectric layer 104, passing over and electrically connecting with the contact 116b. In addition, the conductive line 122 has a laterally swelling portion on an edge portion of the contact 116b, wherein the borders of the laterally swelling portion and the edge portion are contiguous, as mentioned above. The contact 116b and the conductive line 122 may include the same conductive material, which may be a metal material like copper (Cu).

The contact 116b is located in the dielectric layer 104. In this embodiment, the dual damascene structure may further include a contact 118b between the substrate 100 and the conductive line 122 and near the contact 116b.

Figure 2:
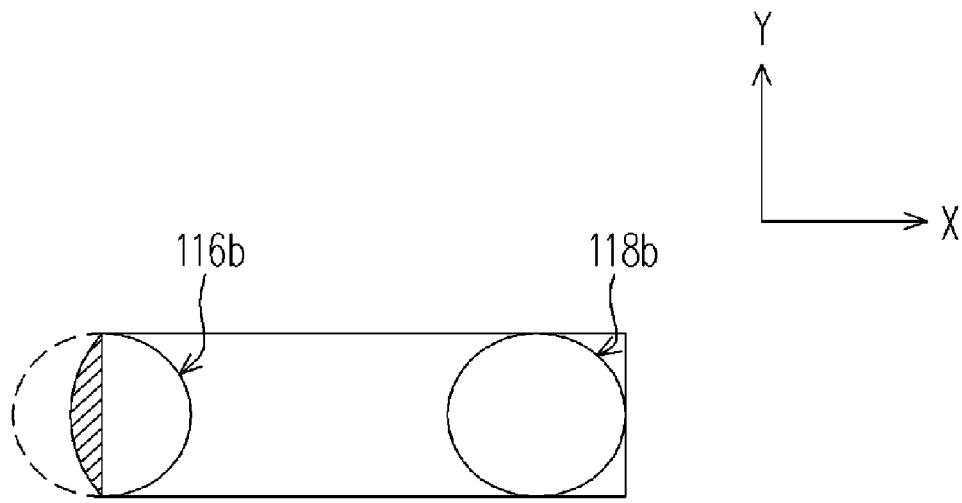
FIG. 2 illustrates a top view of the above dual damascene structure.

Though both of the contacts 116b and 118b are misaligned with the conductive line 122, the contact 118b is different from the contact 116b for it is defined without overlapping with the hard mask layer 108, as shown in FIG. 2. Referring to FIGS. 1F and 2 simultaneously, since the contact hole 118a is defined without overlapping with the hard mask layer 108, the shape of its horizontal cross-section is not affected by the hard mask layer 108 and the contact 118b has a symmetrically rounded outline. On the other hand, because the contact hole 116a is defined exposing a portion of the hard mask layer 108 and only an edge portion 109 (FIG. 1D) of the exposed hard mask layer 108 is removed in the pull-back step, the shape of the horizontal cross-section of the contact hole 116a is affected by the remaining portion of the exposed hard mask layer 108 and the contact 1116b therefore has an asymmetrically rounded outline.

Accordingly, in the method for fabricating a dual damascene structure of this invention, the pull-back step done to the exposed hard mask layer 108 can increase the horizontal cross-sectional area of the misaligned contact 116b, while the increased area is indicated by the shadow region in FIG. 2. Therefore, the contact area between the misaligned contact 116b can be increased to lower the contact resistance and thereby increase the speed of the device.

Figure 3:
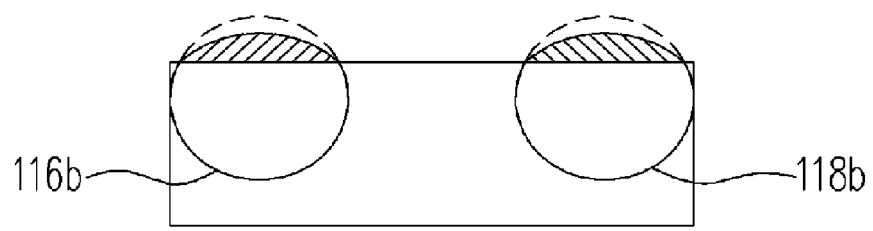
FIG. 3 illustrates a top view of a dual damascene structure according to another embodiment of this invention.

Though the above embodiment is described with misalignment in X-direction of FIG. 2, this invention is surely not restricted to apply to the case. As shown in FIG. 3, when misalignment occurs in Y-direction, the pull-back step can increase the contact areas of both of the misaligned contacts 116b and 118b, while the increased areas are indicated by the shadow regions in FIG. 3. Accordingly, this invention can be readily applied to the cases where misalignments occur in both X-direction and Y-direction.

According to the above embodiment of this invention, since a pull-back step is conducted before the contact-hole etching step to pull back the hard mask layer exposed by the contact-hole pattern of the photoresist layer due to misalignment, the cross-sectional area of the misaligned contact hole can be increased. Thus, the contact area between the misaligned contact and the device can be increased to lower the contact resistance, so as to increase the speed of the device as well as to improve the reliability and even the yield of the products.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for fabricating a dual damascene structure, comprising:
   sequentially forming a dielectric layer and a hard mask layer on a substrate;
   forming a trench pattern in the hard mask layer;
   forming, over the substrate, a first patterned photoresist layer that has a contact-hole pattern therein exposing a portion of the hard mask layer;
   performing a pull-back step to pull back the portion of the hard mask layer exposed by the contact-hole pattern;
   using the first patterned photoresist layer as a mask to remove a portion of the dielectric layer, so as to form an opening in the dielectric layer;
   removing the first patterned photoresist layer;
   using the hard mask layer as a mask to etch the dielectric layer down to the substrate, so as to form, in the dielectric layer, a contact hole and a trench passing over the contact hole; and
   forming a conductive layer in the trench and the contact hole.

2. The method of claim 1, wherein the hard mask layer comprises a metal hard mask layer.

3. The method of claim 2, wherein the metal hard mask layer comprises at least one material selected from the group consisting of Ti, TiN, Ta, TaN and WN.

4. The method of claim 1, wherein the hard mask layer is formed through CVD or PVD.

5. The method of claim 1, wherein the pull-back step comprises a bombardment process.

6. The method of claim 1, wherein the conductive layer comprises copper (Cu).

7. The method of claim 1, wherein the step of forming a trench pattern in the hard mask layer comprises:
   forming a second patterned photoresist layer having the same trench pattern therein on the hard mask layer; and
   using the second patterned photoresist layer as a mask to etch the hard mask layer down to the dielectric layer.

8. The method of claim 1, wherein the dielectric layer comprises a low-k material having a dielectric constant lower than 4.

* * * * *